United States Patent [19]

Kwiatkowski

[11] Patent Number: 5,066,912

[45] Date of Patent: Nov. 19, 1991

[54] CALIBRATABLE NON-CONTACT INDUCTIVE DISTANCE MEASURING DEVICE

[76] Inventor: Richard F. Kwiatkowski, 540 Pearce Mill Rd., Wexford, Pa. 15090

[21] Appl. No.: 549,894

[22] Filed: Jul. 9, 1990

[51] Int. Cl.⁵ .................... G01R 35/00; G01R 33/00; G01N 27/72

[52] U.S. Cl. .................... 324/224; 324/202

[58] Field of Search .................... 324/202, 204, 207.16, 324/207.12, 207.26, 224, 225, 226, 227, 234, 236, 237, 238

[56] References Cited

U.S. PATENT DOCUMENTS

| | | | |
|---|---|---|---|
| 3,926,053 | 12/1975 | Schurrer et al. | 324/224 X |
| 3,929,403 | 2/1976 | Stassart | 324/224 |
| 4,027,233 | 5/1977 | Shmakou et al. | 324/224 |
| 4,030,027 | 6/1977 | Yamada et al. | 324/207.26 |
| 4,103,233 | 7/1978 | Timmermans et al. | 324/207.16 |
| 4,446,427 | 5/1984 | Lovrenich | 324/207.16 |
| 4,551,681 | 11/1985 | Seeley | 324/224 X |
| 4,797,614 | 1/1989 | Nelson | 324/224 X |

FOREIGN PATENT DOCUMENTS 54-21363  2/1979  Japan .................... 329/224

*Primary Examiner*—Kenneth A. Wieder
*Assistant Examiner*—W. S. Edmonds
*Attorney, Agent, or Firm*—Clifford A. Poff

[57] ABSTRACT

A non-contact level measurement system for monitoring distances with very high accuracy between a sensor coil and a metallic object such as a molten liquid level over either very narrow or extended distances. Controllers coupler with heaters, thermocouples, coolant air are provided for maintaining the sensor coil at a operating temperatures within the range of 400° F. and 1200° F. to eliminate variations to the operation of the sensor coil. The system incorporates an L-C resonant circuit connected between the output of an oscillator and the input of an operational amplifier. A variable inductor parallel with the capacitor of the L-C resonant circuit is used to obtain a precise offset operating frequency of the resonant circuit from the frequency of the oscillator.

12 Claims, 3 Drawing Sheets

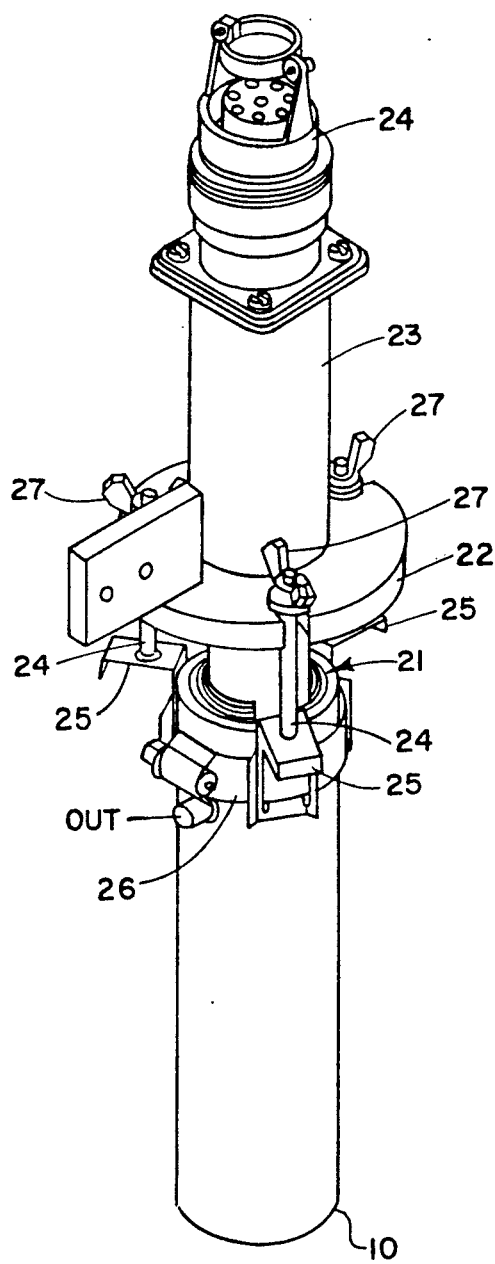
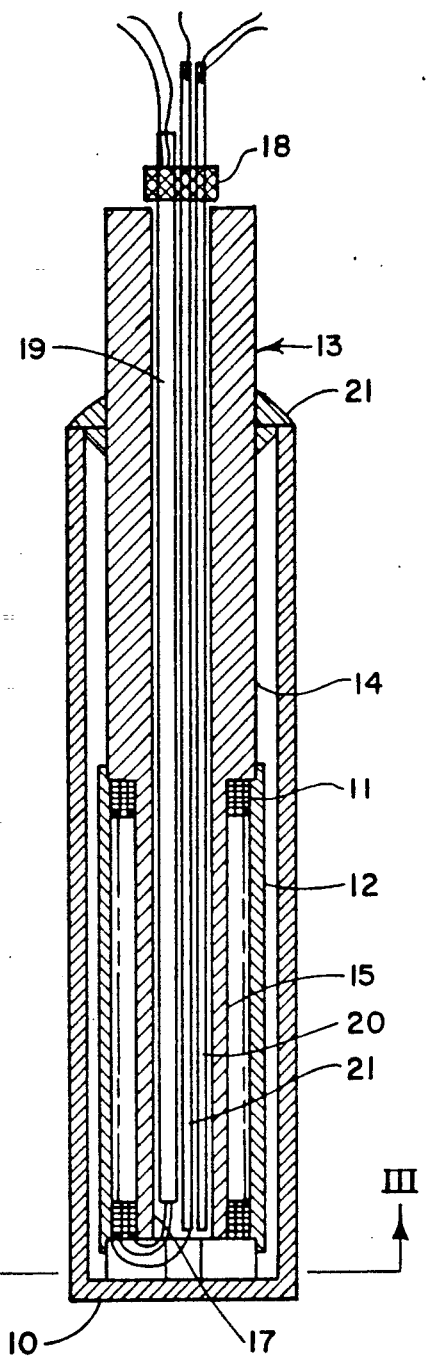
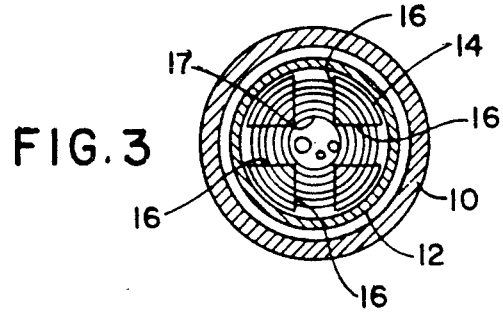
FIG.1
FIG.2
FIG.3

17 
CALIBRATABLE NON-CONTACT INDUCTIVE DISTANCE MEASURING DEVICE

BACKGROUND OF THE INVENTION

1. Field of the Invention

The present invention relates to a non-contact system for detecting the level of a liquid metal bath; it may be used in any system where it is desired to measure the distance between an inductive coil and a metal object, whether that object be ferrous or non-ferrous. The invention finds specific application for monitoring the distance between a conductive fluid such as a molten metal bath in a continuous casting mold and the inductive sensor coil.

An inductive, non-contact distance measurement system for liquid metal bath levels is described, for example, in Yamada et al., U.S. Pat. No. 4,030,027, issued June 14, 1977. In that patent, an inductive coil is employed in the feedback circuit of an operational amplifier having positive and negative input terminals, the negative input terminal is connected to an oscillator and the positive input terminal is connected to the aforesaid feedback circuit. The amplified differential output signal from the amplifier, comprising the difference between the oscillatory signal applied to the differential amplifier and the signal applied to the differential amplifier which varies as a function of the impedance of the detecting coil corresponding to the distance between the detecting coil and the metallic body, are a measure of the distance between the two. At least one of the parameters of open-loop gain of the differential amplifier and the amount of feedback in the feedback circuit are predetermined so as to liberalize at least for a predetermined measuring range the output characteristics of the differential amplifier resulting from the variation of the detecting coil impedance caused by the variation of the distance.

Other systems of this type have attempted to provide a liberalizing change in the detector circuit for changes in the performance of the detector coil with the use of bridges, phase-angle correction circuits, and the like. These earlier circuits incorporated the linearalizing correction upstream of the first operational amplifier or in the feedback path, exemplified by the aforesaid U.S. Pat. No. 4,030,027.

In co-pending application Ser. No. 661,726 filed Oct. 17, 1984, now U.S. Pat. No. 4,956,606, there is disclosed a non-contact, inductive measuring system for monitoring the distance between a metallic object, such as the top surface of molten, liquid metal bath and a detection coil capable of accurately measuring small separation distances as well as extended separation distances without moving or repositioning the coil.

The detecting coil is surrounded by heat-insulative sleeve within a sensor shell. An open end of the shell is fitted to a air flow ducts such that coolant air can pass centrally to the coil and along an annular discharge flow space to the air discharge duct.

The coil is electrically coupled in a series arrangement with a capacitor to form a series resonant, L-C circuit. The L-C circuit is connected to an input terminal of an amplifier and an oscillator is connected to a second input to the amplifier. The frequency of the oscillator is offset with respect to the resonant frequency of the L-C circuit, whereby the output signal of amplifier is essentially linear. This signal, the magnitude of which varies in proportion to the separation distance between the coil and a metallic object, is supplied to temperature compensation circuit which functions to take into account variations of the output signal due to fluctuations of the power supply voltage, the temperature of the environment of the electronic circuit, and the temperature of the coil. The output signal of temperature compensation circuit is supplied to readout.

SUMMARY OF THE INVENTION

It is an object of the present invention to provide a new and improved non-contact distance measuring system for monitoring the distance between a detecting coil and a metallic object with very high accuracy by the production of a stable and wide ranging output signal having negligible temperature sensitivity.

Another object of the present invention is to provide a detecting coil assembly wherein electrical properties of the associated detecting coil are controlled and stabilized by maintaining a high temperature operating environment such as between 400° F. and 1200° F.

A further object of the present invention is to provide a non-contact distance measuring system embodying a design to enable the manufacture of a detection coil assembly for very small mold or applications where, for example, the detection coil assembly can be as small as ¼ inch without sacrificing accuracy.

A particularly significant departure from known measuring systems is the provision for the detecting coil to operate at substantially elevated temperature such as at least 400° F. and generally not greater than 1200° F. The detecting coil may be air cooled when the detecting coil assembly is situated in furnace, for example, where the ambient temperature is greater than the desired elevated operating temperatures of the detecting coil assembly. The system of the present invention embodies an assembly of parts to allow for electronic calibration during operation of the measuring system.

More particularly there is provided according to the present invention apparatus for measuring the distance between a detecting coil and a metal object, the apparatus including a detecting coil, an electronic circuit including an amplifier responsive to a signal by the detecting coil whereby a signal appearing at the output of the amplifier will vary as a function of the distance between the detecting coil and an adjacent metallic object, control means for maintaining the detecting coil at a predetermined elevated operating temperature of at least about 400° F. to minimize variations affecting operation of the detecting coil, means forming an enclosure enveloping the detecting coil and the heater means to maintain the elevated operating temperature of the detecting coil, and means responsive to the signal appearing at the output of the amplifier for indicating the distance between the detecting coil and an adjacent metal object. The aforesaid control means may take the form of one or more of a temperature controller, heater, thermocouple and a control air flow all for controllably maintaining a desired elevated operation temperature of the detecting coil.

According to another aspect of the present invention, there is provided apparatus for measuring the distance between a detecting coil and a metallic object comprising, an oscillator, an amplifier, an L-C-L circuit including a detecting coil and a capacitor in series connecting the output of said oscillator to the input of said amplifier whereby the amplitude of the signal appearing at the output of said amplifier will vary as a function of the distance between said detecting coil and an adjacent metallic object, and inductive means connected parallel with said capacitor for calibrating the operation of said detecting coil.

BRIEF DESCRIPTION OF THE DRAWINGS

These features and advantages of the present invention as well as others will be more fully understood when the following description is read in light of the accompanying drawings in which:

FIG. 1 is an isometric view of one embodiment of a detecting coil assembly embodying the features of the present invention;

FIG. 2 is a partial elevational view in section of the detecting coil assembly shown in FIG. 1;

FIG. 3 is a sectional view taken along lines III—III of FIG. 2;

FIG. 6 is a plot of distance verses a wide ranging output voltage of the system of the present invention.

DETAILED DESCRIPTION OF THE INVENTION

Figure 4:
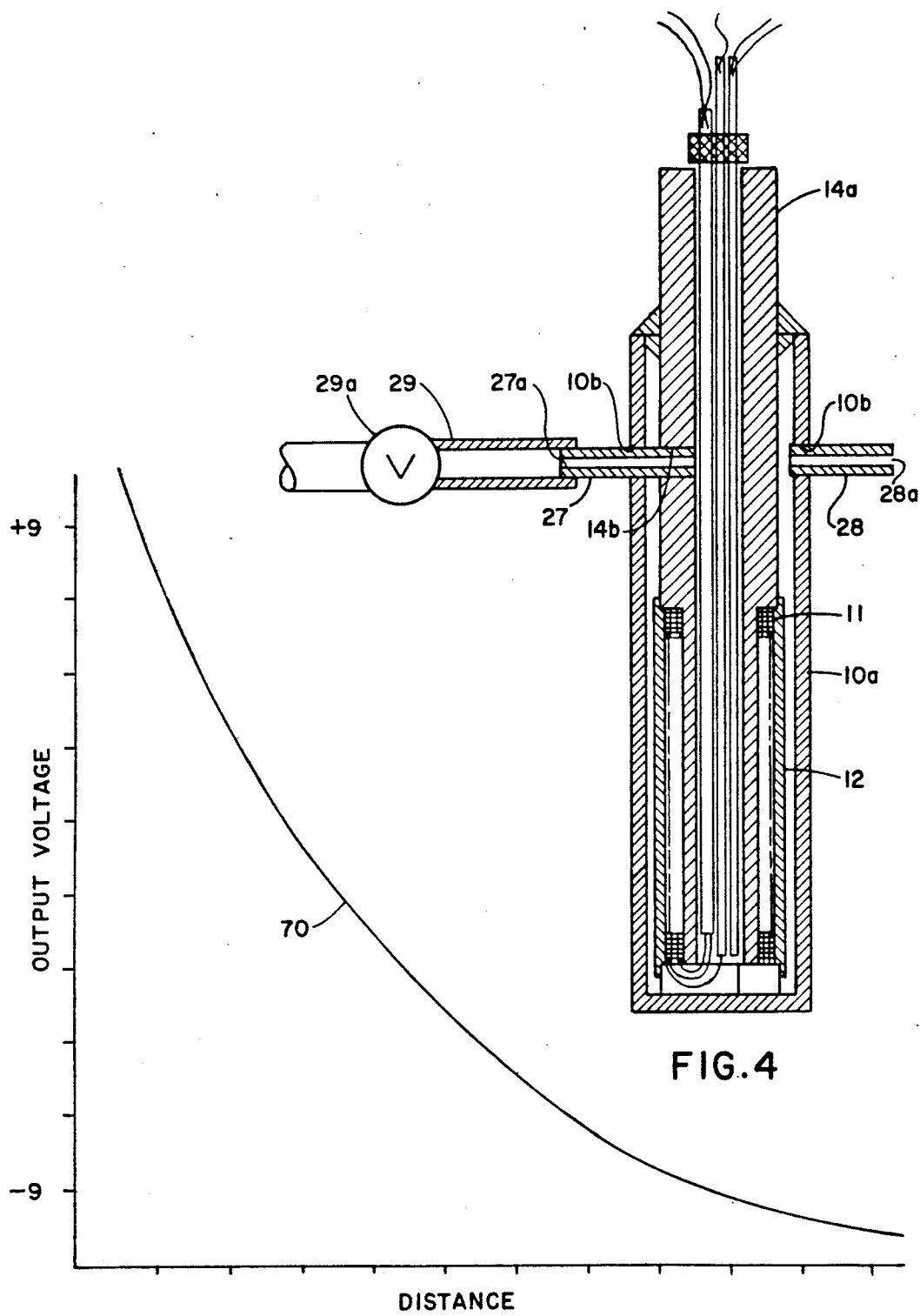
FIG. 4 is a partial elevational view in section illustrating a second embodiment of the detecting coil assembly.

In FIGS. 1 and 2 there is illustrated one embodiment of a core cover 10 used according to the present invention to form an air tight enclosure enveloping an inductive sensor that essentially includes a detecting coil 11 protected by a cemented high temperature refractory forming thermal barrier 12. The container structure is designed and constructed to withstand a continual internal operating temperature at the site of the detecting coil, of at least 400° F. but usually not greater than 1200° F. Typically, the detecting coil is maintained at a temperature of about 600° F. A discovery of the present invention was to abandon the common practice of using cooling to maintain the inductive sensor coil at approximately ambient room temperature. Instead, at the elevated operating temperature according to the present invention it was discovered that the inductance and capacitance of the detecting coil can be varied by temperature level changes and controlled and thereby negate the temperature affects to the operation of detecting coil. The core cover is made of refractory such as alumina, to minimize heat loss to the internal volume of the cover. A core assembly 13 includes a core support 14 made of ceramic material and provided with an annular recess 15 to form a support site for a wound wire core comprising the detecting coil 11. As shown in FIG. 3, a crossing pattern of groves in the lower end of the core support 14 provides passageways 16 for leads of the coil 11 so that the leads can pass through a central bore 17 in the core. A collar 18 supports the leads at the top of the core assembly 13. Electrical insulators 19 cover the portion of each lead which extends along the central core 17. An electrically powered heater 20 and a thermocouple 21 are also located in the bore 17 and situated in the lower portion of the bore which is in close proximity to the detecting coil 11. At the top of the core cover, the core assembly 13 is cemented to the core cover 14 by a layer of cement 21 that seals the gap between these members. As shown in FIG. 1, an anchor flange 22 on the bottom of an electrical connector fixture 23 has three slotted openings each receiving a shank portion of a bolt 24. The head portion of the bolts are held by brackets 25 which are in turn held on the outer top surface of the cover by a clamp 26. Nut members 27 are tightened on the threaded portions of bolts 24 to draw an internal seat surface in the fixture 23 against the top of the core assembly 13. An electrical connector 24 at the top of fixture 23 receives mating connector having lead wires of the detecting coil, heater and thermocouple extending to the electrical circuit shown in FIG. 3.

FIG. 4 illustrates a second embodiment of inductive sensor which differs from the sensor construction of FIGS. 1-3 only by provision of an air cooling system which is utilized to maintain the internal operating temperature of the sensor at the desired operating temperature, for example, of 600° F. This embodiment of a sensor is intended for use in a highly heated environment such as a furnace where cooling is necessary to prevent the internal temperature of a sensor rising to the highly heated ambient temperature in the furnace which can be greater than 2000° F. The elements identified in the embodiment of FIG. 1-3 which are identical with the elements in the embodiment FIG. 4 bear the same reference numerals. The core cover 10A is made of refractory material such as alumina and is provided at its upper portion with diametrically arranged openings 10B. The core 14A is provided with a annular opening 14B in alignment with one of the openings 12B in the cover 12A. A rod member 27 is placed in aligned openings 12B and 14B such that a bore 27A communicates with the central bore 17 in the core 14A. A rod member 28 is fitted in the other openings 10B and provided with internal passageway 28A for communicating with the internal space between core 14A and core cover 10A. A duct 29 is connected to a rod member 27. A valve 29A is adjusted to give a desired air flow to control and insure the maintenance of a predetermined desired operating temperature for the induction detecting coil 11. The heater 20 and thermocouple 21 are used to maintain the desired operating temperature in conjunction with the controlled flow of cooling air. The direction of airflow can be reversed if desired, the purpose of the air being to maintain the elevated temperature of the coil 11.

Figure 5:
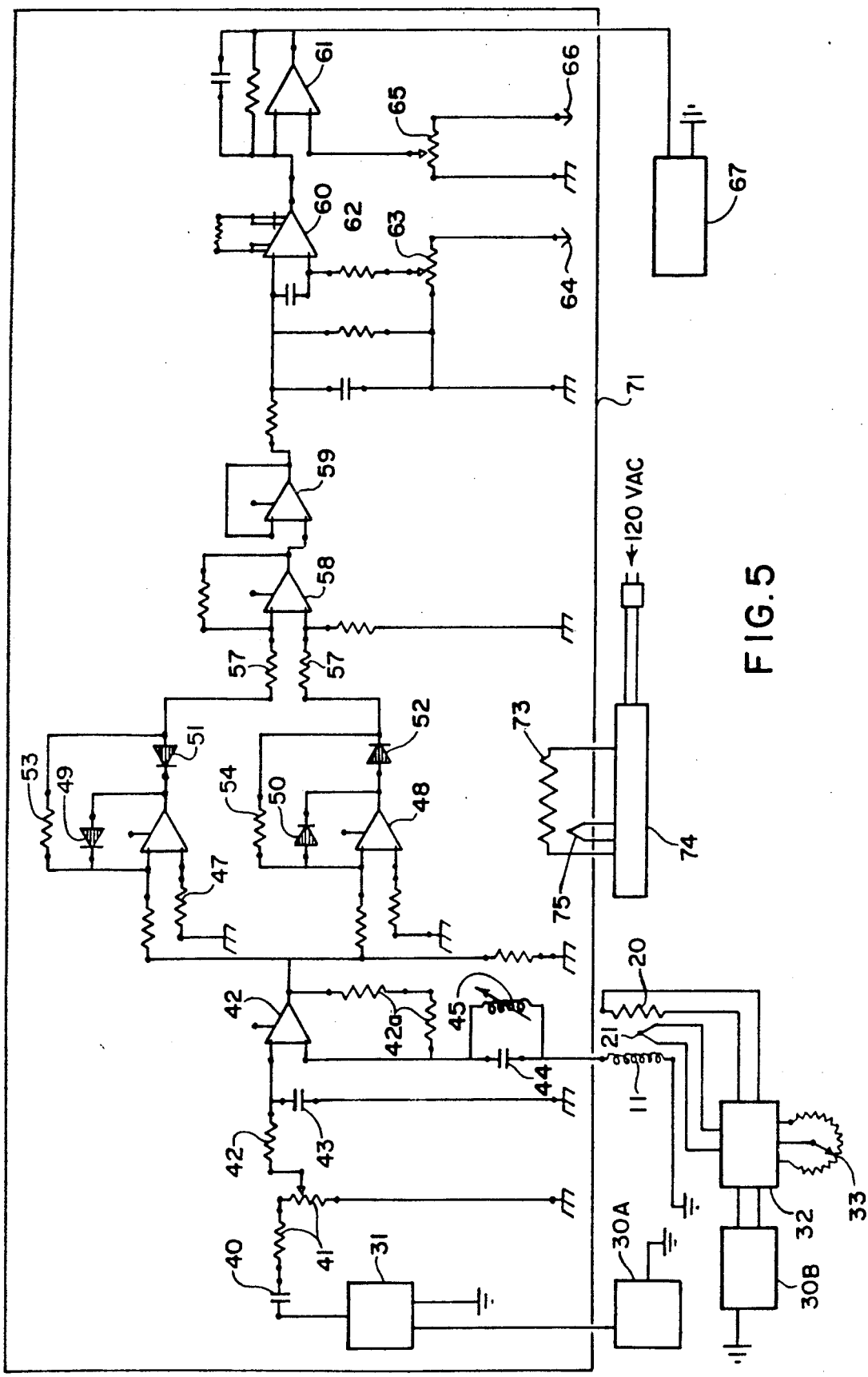
FIG. 5 is a schematic circuit diagram of one embodiment of the invention.

The electrical circuit of FIG. 5 employs the principles of the present invention. A power supply 30A is connected to an oscillator 31 and another power supply 30B to temperature controller 32. A potentiometer 33 is part of the controller 32 and is used to select a inductive detecting coil 11 temperature. The heater is controlled in response to the desired operating temperature in relation to the actual operating temperature which is derived by the thermocouple 21 and applied to the temperature controller as an actual operating temperature signal.

The oscillator 31 produces an output signal applied by voltages setting resistors 41 to a positive input leg of a operational amplifier 42. Capacitor 40 eliminates any direct current component of the applied reference output signal at the positive input leg of amplifiers 44. Capacitor 43 is a filter for unwanted A-C signal, a lead of capacitor 43 is connected to the ground. The sensor coil 11 and a capacitor 44 are connected to the negative input leg of amplifier 42. The variable inductor 45, the capacitor 44 and coil 16 form a L-C-L resonant circuit coupled to a negative feed leg of the amplifier 42. Variable inductor 45 is preferred but can be eliminated. When eliminated, it can be seen therefore that the sensor coil 11 and capacitor 44 form a series L-C resonant circuit. Resistors 42A are connected in series in a feedback path between the output of amplifier 42 and its negative leg. In accordance with the present invention there is also provided a variable inductor 45 applied across capacitor 44 to electronically calibrate the electronic system. The inductor 45 can be varied to check the operation of the system during usage of measuring system. The inductor also permits the selection of an offset operating frequency with great precision. The offset frequency being a frequency that is offset from the frequency of the oscillator applied to amplifier 42 via the positive input leg. The output signal from amplifier 42 is A-C signal which varies with the distance between the detection coil 15 and the metal body formed by liquid metal whose level in being measured. This signal is applied by branch lines through voltage setting resistors to a parallel arrangement of amplifiers 47 and 48 having feed-back paths containing diodes 49 and 50, respectively. Downstream of these feed-back paths containing diodes 49 and 50, the respective output signals from amplifiers 47 and 48 are connected to diodes 51 and 52, respectively. Voltage setting resistors 53 and 54 are coupled to form a feedback path on the respective amplifiers 47 and 48 which path is downstream of the diodes 51 and 52, respectively. Diodes 49 and 50 associated with amplifier 47 form a half wave rectifier for the negative going part of the A-C signal while diodes 50 and 52 associated with amplifier 48 form a halfwave rectifier for a positive going part for the A-C signal. The output of the half wave rectifiers appearing on lines 55 and 56 are applied through voltage setting resistors 57 to a summing amplifier 58 whose output is a D-C signal that is applied to buffer amplifier 59. The output of amplifier 59 is applied to a final two stage amplifier which is provided by amplifier 60 whose output is applied to amplifier 61. The signal applied to amplifier 60 is applied to the negative leg while the positive leg is coupled through a resistor 62 through a potentiometer 63 used to set the voltage level potential of the negative level at a predetermined desired voltage. Similarly amplifier 61 has the negative leg receiving the amplified output from amplifier 60 while the positive leg receives a signal established by potentiometer 65 to obtain a predetermined voltage set level. A digital readout device 67 displays the signal received from the output of amplifier 61 which indicates the distance between the coil 11 and a molten bath, for example, in inches. In FIG. 5 there is illustrated a housing which encloses the electronic circuitry contained within the boarders in the housing. The housing is identified by reference numeral 71 and in a conventional way encloses a circuit board on which the components are mounted. Above and below the circuit board in the housing there are situated heaters 73. The heaters are in spaces above and below the circuit board and are connected to a controller 74 which is in turn connected to a conventional power supply such as 110 VAC The thermocouple 75 is used to monitor and control the temperature of the heaters. The heater for the electronics is used according to the present invention, to maintain the environment for the electronics at a temperature above the normal room temperature such as, for example, 90° F. In this way through the use of the controlled environment for the electronics the performance of the electronic components is stable.

It is important to select a resonant frequency of the L-C-L circuit comprised of sensor coil 11 and capacitor 44, which is different than the output frequency of the oscillator 31 in order to obtain a widely ranging output that can be monotonic from amplifier 61 over a large distance. This is illustrated, for example, in FIG. 6 for an L-C-L circuit (i.e., elements 11, 44 and 45) having a resonant frequency of 18,324 Hertz. Operating the oscillator 31 at an off-resonant frequency of 18,229 Hertz produces curve 70 in FIG. 6. Preferably, the off-resonant frequency variation is less than 0.10% of the resonant frequency. Note that curve 70 may be linear but more importantly faithfully produced through operation of the measuring system because of: 1.) the constant elevated operating temperature of the sensor coil 11 through the use of electrical heaters gives stable thermal operating temperature environment, 2) the particular operating temperature is selected to give an optimal inductance of the coil, 3) the precision with which the offset frequency can be selected through the unique use of variable inductor 45, and 4) housing the electronic components in a temperature controlled environment to operate above normal ambient temperatures. An extremely high widely ranging output signal of, for example, 18 volts shown in FIG. 6 ranging from a minus 9 volt value to a plus 9 volt value allows correlating this voltage range to units of distance. This voltage range can be applied to a molten level range of 1 inch or 10 inches. Important is the fact that the configuration of graph line 70 will always remain constant so that incremental voltages can always be reliably related to incremental distances. Although the invention has been shown in connection with a certain specific embodiment, it will be readily apparent to those skilled in the art that various changes in form and arrangement of parts may be made to suit requirements without departing from the spirit and scope of the invention. In this respect, the range of measurement can be varied by varying circuit parameters. The thermocouple shown herein, for example, can be replaced by a thermistor, RTD wire or the like which provides a temperature signal proportional to the coil temperature and/or the coolant temperature.

While the present invention has been describe in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

I claim:
1. Apparatus for measuring the distance between detecting coil and a metal object, said apparatus including:
   a detecting coil enveloped in an enclosure to maintain an elevated operating temperature for the detection coil;
   means for supplying a controlled air flow used in conjunction with said heater and thermocouple to maintain a desired operating temperature to said detecting coil;
   an electronic circuit including an amplifier responsive to a signal by said detecting coil whereby a signal appearing at the output of said amplifier will vary as a function of the distance between said detecting coil and an adjacent metallic objection; and
   control means including an electrical heater coupled to a temperature control responsive to a signal of a thermocouple for maintaining said detecting coil at an predetermined constant operating temperature of at lest 400° F. in conjunction with said means for supplying a controlled air flow to minimize temperature variations affecting operation of said detecting coil.

2. The apparatus according to claim 1 wherein said control means includes means for supplying a controlled air flow to said detecting coil.

3. The apparatus according to claim 1 wherein said electronic circuit further includes an L-C circuit including said detection coil and a capacitor connected to a second input of said amplifier.

4. The apparatus according to claim 3 wherein said L-C circuit comprises a series resonant circuit.

5. The apparatus according to claim 4 wherein said amplifier comprises an operation amplifier having positive and negative input legs, an output terminal of said oscillator being connected to the positive input leg of said operational amplifier, and said L-C circuit being coupled to the negative input leg of said operational amplifier.

6. Apparatus for measuring the distance between a detecting coil and a metal object, said apparatus including:
   a detecting coil enveloped in an enclosure to maintain an elevated operating temperature for the detection coil;
   an electronic circuit including a capacitor in series with said coil connected to a negative input of an amplifier for responding to a signal by said detecting coil whereby a signal appearing at the output of said amplifier will vary as a function of the distance between said detecting coil and an adjacent metallic object, said electronic circuit further including a variable inductor connected parallel with said capacitor for calibrating the operation of said detecting coil.

7. The apparatus according to claim 6 wherein said electronic circuit further includes second amplifier means having inputs for establishing the voltage level potential to the operating range of the respective amplifiers.

8. Apparatus for measuring the distance between a detecting coil and a metallic object, said apparatus comprising:
   an oscillator;
   an amplifier;
   an L-C circuit including a detecting coil and a capacitor in series connecting the output of said oscillator to the input of said amplifier whereby the amplitude of the signal appearing at the output of said amplifier will vary as a function of the distance between said detecting coil and an adjacent metallic object; and
   inductive means connected parallel with said capacitor for calibrating the operating of said detecting coil.

9. The apparatus according to claim 8 wherein said inductive means is an inductor.

10. The apparatus according to claim 8 wherein said inductive means is variable.

11. Apparatus for measuring the distance between a detecting coil and a metallic objection comprising:
    an oscillator;
    an amplifier;
    an L-C circuit including a detecting coil and a capacitor connected to the input of said amplifier whereby the amplitude of the signal appearing at the output of said amplifier will vary as a function of the distance between said detecting coil and an adjacent metallic object;
    a variable inductive means connected parallel with said capacitor for electronic calibration of said L-C circuit;
    a casing enclosing said detecting coil;
    heater means in said casing for heating said detecting coil to an elevated temperature to minimize deviations affecting the operating of said detecting coil; and
    means for indicating the amplitude of said output signal and, hence, the distance between said detecting coil and an adjacent metallic object.

12. Apparatus for measuring the distance between a detecting coil and a metal object, said apparatus including:
    a detecting coil enveloped in an enclosure to maintain an elevated operating temperature for the detection coil;
    an electronic circuit including an amplifier responsive to a signal by said detecting coil whereby a signal appearing at the output of said amplifier will vary as a function of the distance between said detecting coil and an adjacent metallic object;
    control means for maintaining said detecting coil at a predetermined constant operating temperature of at least 400° F. to minimize variations affecting operation of said detecting coil;
    enclosure means discrete from said enclosure enveloping the detecting coil for electrical components of said electrical circuit; and
    means including an electrical heater for maintaining a constant temperature environment.

* * * * *